US005337468A

United States Patent [19]

Zahn

[11] Patent Number: 5,337,468

[45] **Date of Patent: * Aug. 16, 1994**

[54] CONTINUOUS MOLDED ELECTRONIC COMPONENT ASSEMBLY

[75] Inventor: Irwin Zahn, New York, N.Y.

[73] Assignee: Autosplice, Inc., San Diego, Calif.

[ * ] Notice: The portion of the term of this patent subsequent to Sep. 22, 2009 has been disclaimed.

[21] Appl. No.: 949,384

[22] Filed: Sep. 22, 1992

Related U.S. Application Data

[63] Continuation of Ser. No. 841,872, Feb. 26, 1992, Pat. No. 5,148,596.

[51] Int. Cl.[5] .............................................. H05K 3/30

[52] U.S. Cl. .................................... 29/842; 29/564.6; 29/739; 29/881; 29/883; 206/330; 264/272.14

[58] Field of Search ................. 29/739, 741, 842, 881, 29/883, 884, 564.6; 206/328, 330, 332, 346; 264/272.14; 439/590, 885

[56] References Cited

U.S. PATENT DOCUMENTS

| | | | |
|---|---|---|---|
| 2,964,171 | 12/1960 | Chadwick | 206/330 X |
| 3,743,087 | 7/1973 | Wise | 206/330 |
| 4,214,361 | 7/1980 | Coldven et al. | 29/564.6 X |
| 4,586,607 | 5/1986 | Dubbs et al. | 206/330 X |
| 5,148,596 | 9/1992 | Zahn | 29/842 |

*Primary Examiner*—Carl E. Hall
*Attorney, Agent, or Firm*—Rosen, Dainow & Jacobs

[57] ABSTRACT

A continuous molded electronic component assembly process in which a continuous line of components are supplied on reels for assembly and insertion. The supply reels of electronic components are made by an injection molding process, reeled and supplied to assembly and insertion machines. The assembly and insertion machines provide the means for removing, assembling and inserting the electronic components. Examples of the process, but not limited to, are shunts, wire end terminals and pilot posts.

2 Claims, 5 Drawing Sheets

CONTINUOUS MOLDED ELECTRONIC COMPONENT ASSEMBLY

This application is a continuation of application Ser. No. 07/841,872, filed Feb. 26, 1992, now U.S. Pat. No. 5,148,596.

FIELD OF THE INVENTION

This invention relates to the field of electronic components and their improved mechanized assembly.

BACKGROUND OF THE INVENTION

For low cost fabrication and assembly of many electronic/electrical products, it is necessary to establish an efficient mechanized method of joining electronic components onto printed wiring boards and other workpieces. Currently, there exist mechanized systems to apply electrical hardware components such as pin terminals, tabs, sockets, etc. to their appropriate workpieces. But many other components continue to rely on manual assembly. For example, the machine disclosed in U.S. Pat. No. 4,318,964 provides an apparatus with a supply strip for inserting terminals into a substrate or workpiece. The supply strip is a continuous strip of metal pins wound on a reel. To insert a pin into a printed wiring board (PWB), a pin is separated from the rest of the strip, then pressed down into the PWB. Another machine of this type is described in U.S. Pat. No. 4,807,357.

The current systems are used for assembling of pins or tabs or sockets into substrates. The pin insertion machines allow for insertion of different sizes of pins onto an apertured workpiece. The pins can vary in cross section and length. They can also be bent to 90° angles or kept straight. The machine is fed from a continuous supply of prenotched pins wound on a reel. The pins are fed, cut, formed and then inserted into the workpiece positioned below the inserter. The alignment of the insertion hole with the pin can be achieved by manually positioning the workpiece below the insertion head, or automatically by a computer-controlled X-Y locating table onto which PWB's are loaded. A similar type of machine can be used to insert sockets, or tabs or other components into PWB's. Any socket pattern can be machine inserted or can be inserted into a plastic housing for manual insertion. The above systems describe production systems to insert pins or sockets into substrates. It is accomplished by inserting one pin or one socket or one tab at a time.

Other prior art includes a system that inserts many pins, up to as many as 50 at one time. The idea is similar to the previous system in that a continuous supply of header mounted pin components are stored and fed from a reel. The difference is that the pins are first perpendicularly inserted into an extruded plastic header which is then stored on the supply reel. The endless electrical connector described An U.S. Pat. No. 4,832,622 is an example of one such system. A machine automatically cuts a header with a desired, pre-set amount of pins from the supply reel. An inserter head then places the header onto a PWB. While this system increases the efficiencies of some of automated component assembly, it is still not fully automated for other hardware components. Three examples follow which illustrate (and not limit) those components which up until nee have resisted mechanized assembly.

One example of a electrical component that is currently being made individually and manually assembled is an electrical shunt connector or Jumper, which is in common use today to interconnect pins to configure, for example, a printed circuit board. The plastic body of the shunt is currently individually molded, and a stamped metal conductor is inserted into the plastic body and then the completed shunt assembly is manually mounted on the PWB pins, using templates or light to properly locate the pins on which the shunt is to be assembled. The process is labor intensive, expensive and causes re-work of boards if the shunt is improperly positioned.

Another example and an important electronic component is wire end terminals. Their assembly onto wires has not been automated yet. The end terminal needs to be placed on the wire and is done so manually and individually. There is no known system that allows for the mechanized assembly of such components.

Another example is in situations where the system has inserted long rows of male metal connector pins into a PWB. Problems arise when the female connector then has to be mated. For instance, when the connector is being mated the pins might bend if the assembly is not done evenly along the axis of the pins. The problem is exacerbated when connectors are used with high pin counts. Typically, the problem of the bent pins is solved with a shrouded header that has an integrally molded pilot at either end of the header. The female connector first mates with the pilot (which is higher than the pins) and this assures that the axis of the pins and that of the connectors are properly aligned. But, the shrouded header with its integrally molded pilot is expensive, and it takes time to configure and assemble for a particular connector.

Among the common disadvantages in the assembly of the three component examples described above are the high cost and that individual handling of loose pieces are still required in the manufacture or assembly process. This is time consuming and costly. Furthermore, the expense of ordering and storing loose electronic parts is high. While the problem is particularly acute with the above described three components, there are other components whose manufacture and assembly involve similar problems.

SUMMARY OF THE INVENTION

A principal object of the invention is a process to efficiently mechanize the manufacturing and assembling of electronic parts.

A further object is the integration of sore aspects of the manufacturing and production so that the end product can be made more efficiently and less costly.

Another object is to avoid or minimize the need for individual handling of loose pieces in the manufacture and assembly of electrical components.

Another object of the invention is to automate the manufacture and assembly of electrical shunt connectors.

Still another object of the invention is to mechanize the process of mounting insulated posts on PWBs to serve as pilots for connectors.

A further object Is to fully automate the process of wire terminals and their assembly to wires.

These and other objectives are achieved, briefly speaking, by a novel process which involves molding an endless line of plastic parts. Where the parts have complex shapes, as in the above-described three components, a continuous injection molding process is preferably employed. The endless line of parts is wound on a reel. Once in reel form, then the known automatic machines can then be directly employed or readily modified to process at a high production rate the reeled parts. It may require several machine passes before the component or its assembly onto a workpiece is completed. Thus the reeled parts can be fed to a machine which punches holes, inserts metal parts, or performs other secondary operations on the plastic pieces, and then rereels the worked pieces. Another pass through an insertion machine can sever one or more of the parts as needed from the supply reel and mount the parts onto the appropriate workpiece. In this manner, more of the production process of the electronic components can be automated.

A feature of the invention is the initial formation of a continuous molded product on a reel. The reel can be used to hold virtually any number of plastic parts in a variety of shapes needed for a particular application. The reel is then mounted on one of the kinds of assembly, insertion or crimping machines previously described and supplies an endless line of parts that can be added to or inserted on another part aligned by the machine. Manual handling then reduces to transport of supply reel from machine to machine or to a customer provided with a similar applicator machine employing such reels for automatic assembly of the reeled components onto a PWB. Thus, the invention provides flexibility and versatility in the variety and the amount of parts to be manufactured and assembled onto their corresponding workpieces.

In accordance with a preferred embodiment of the invention, a shunt connector is manufactured by injection molding a continuous line of plastic body parts and winding on a first reel. The first reel is mounted on one of the automatic assembly machines which, from a supply of metal parts inserts the metal contact spring clip into each body part as it passes through the machine and is re-reeled onto a second reel. The second reel is placed on another insertion machine which then severs a plastic body part with its metal contact spring clip from the endless supply and mounts it on pin terminals of a PCB accurately positioned below.

In accordance with another preferred embodiment of the invention, wire end terminals can be manufactured and crimped to lead wires. As before, an endless line of plastic parts are made by a molding process and wound on a reel. They are then fed to an assembly machine that in a secondary operation inserts the metal tube connector, and after supplying a wire, crimps the metal connector into place.

In accordance with a third preferred embodiment of the invention, a continuous row of plastic posts is molded, wound onto a reel, and then inserted in a PWB by the previously described inserter machine from a reel supply.

It is thus evident that a variety of electronic components can be efficiently manufactured and assembled by use of the reel supply of an endless line of plastic molded parts subsequently worked and re-worked in reel-supplied, automated, insertion and assembly machines to minimize the handling of loose pieces.

The process generally entails: (1) molding, (2) reeling, (3) secondary operations of assembly when required and re-reeling, (4) insertion. The assembly, insertion and crimping machines are already known and used in the art. Thus, this aspect of the invention describes a process that efficiently mechanizes the manufacturing, assembly and insertion of electrical components achieved by integrating the supply reels of continuous strips of electronic component parts. This minimizes handling, expense and time of manufacturing and assembly of electronic components.

The invention also includes novel competent parts, assemblies and sub-assemblies and reels of such parts produced as intermediate or end products in the carrying out of the process of the invention.

BRIEF DESCRIPTION OF THE DRAWINGS

The invention will now be described in detail with respect to several preferred embodiments with reference to the accompanying drawings, wherein.

DETAILED DESCRIPTION OF PREFERRED EMBODIMENTS

Figure 1:
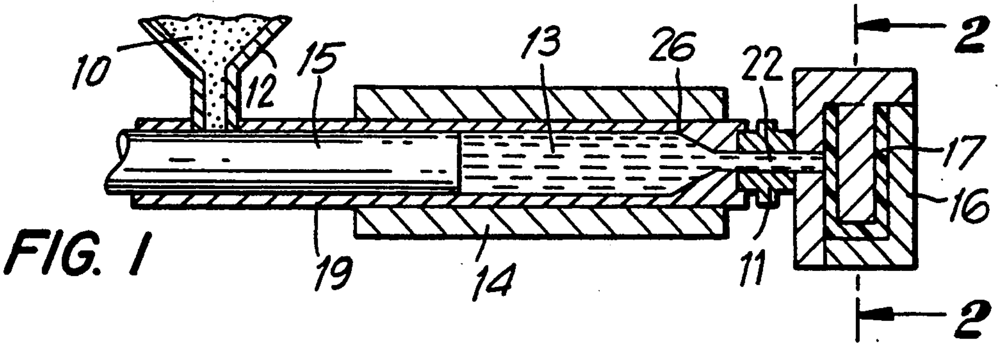
FIG. 1 schematically illustrates an injection molding process for the plastic housing of a shunt.

To show the environment of the invention, reference is first made to FIG. 1 which illustrates the starting point of the invention, which is an injection molding process. One example is the injection molding process disclosed in U.S. Pat. No. 4,832,622, which is incorporated herein by reference. The preheating, plasticizing and molding is all done by the ease machine. Granules of plastic 10 are fed into an injection cylinder 19 through a hopper opening 12. The granules are then heated to a molten state 13 in the cylinder 19 by a heating jacket 14. The molten plastic is then injected by a ram 15 into mold 16 as shown in FIG. 1.

The mold 16 makes a discrete amount of plastic parts 17, all interconnected by thin plastic severable strips or webs 18. The webs 18 are also fond during the molding process. At the end of each completed strip of parts and webs, there is an end extension or web 27, the free end of which is placed back into the mold so that the next strip of parts is molded and fused onto it. This process continues after each molding step. In this fashion, an endless or continuous elongated strip of plastic parts, held together by the webs 18, can be manufactured. All of the plastic parts are connected together by the thin plastic severable pieces, or webs, except for the first and last part which have only one connecting side.

Figure 2:
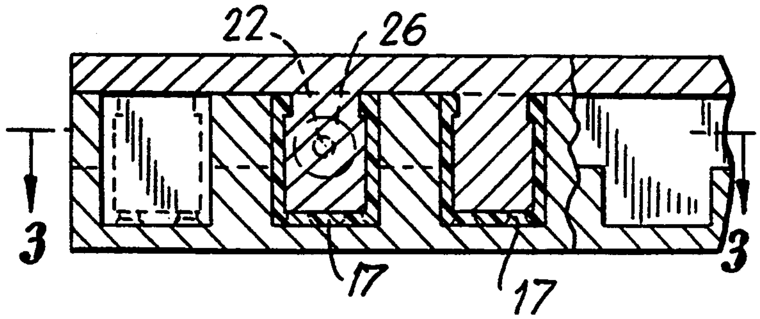
FIG. 2 is a cross-section of the mold of FIG. 1 taken along the line 2—2.
Figure 3:
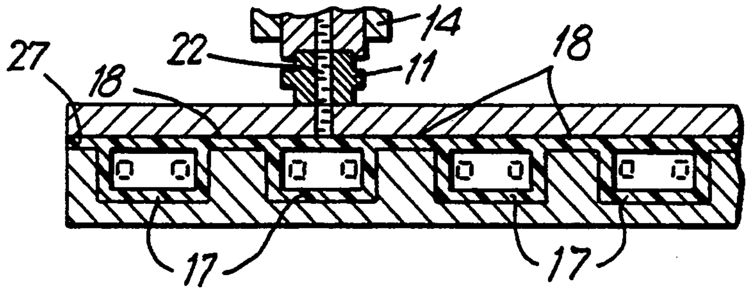
FIG. 3 is a cross-section of the mold of FIG. 2 taken along the line 3—3, and also showing a part of the injection gun for injecting hot plastic into the side of the sold.
Figure 4:
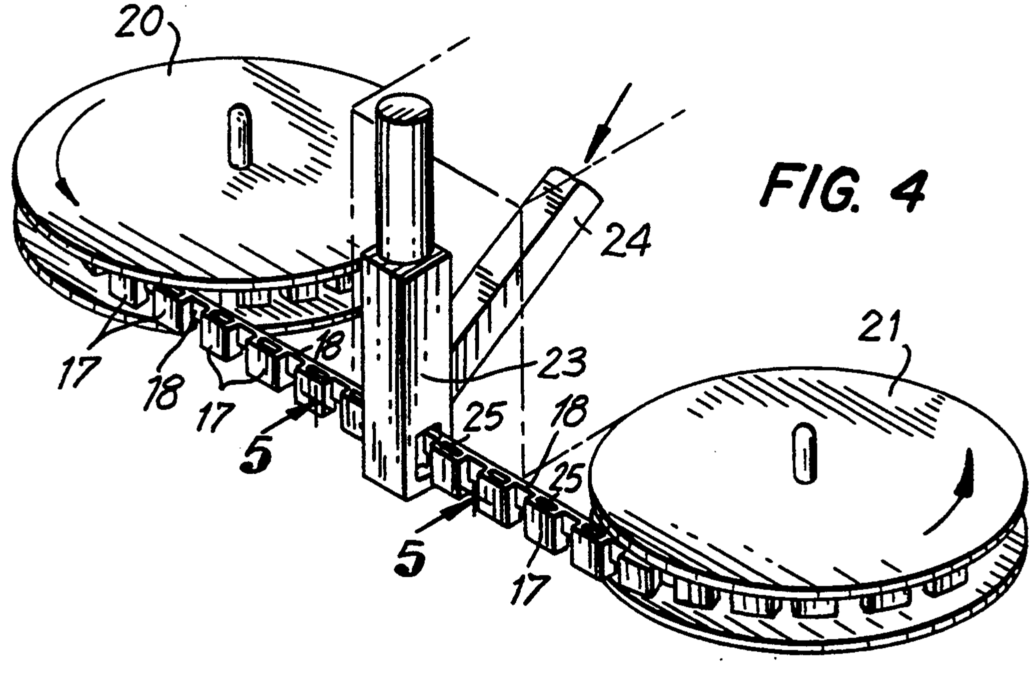
FIG. 4 shows a supply reel of the continuous plastic housing parts of shunts feeding into a metal spring clip insertion machine, to receive a metal insert, and then being rewound on another supply reel after receiving the metal insert.

FIGS. 1–3 show the manufacture of the shunt housing 17. The shunt housings 17 are connected to one another by webs 18 as shown in FIG. 3. As each strip of parts is made, it is connected to the next strip as previously described by means of the web 18. The continuous strip of shunt housing parts 17 is then wound onto a reel 20 and fed into an assembly machine which inserts a metal spring clip 25 and rewinds the continuous shunt strip now with the metal inserts back onto another reel 21. This is shown in FIG. 4. Machines of the type described have been previously disclosed and are already on the market. Only the insertion head 23 for the shaped metal spring clips is shown in FIG. 4.

Figure 5:
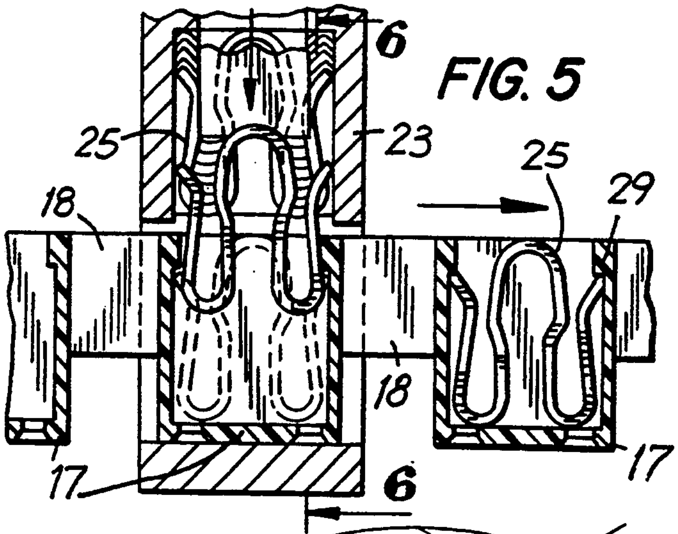
FIG. 5 is a cross-section along the line 5—5 of the shunt housing of FIG. 4 showing how the metal connector piece is inserted into the housing.
Figure 6:
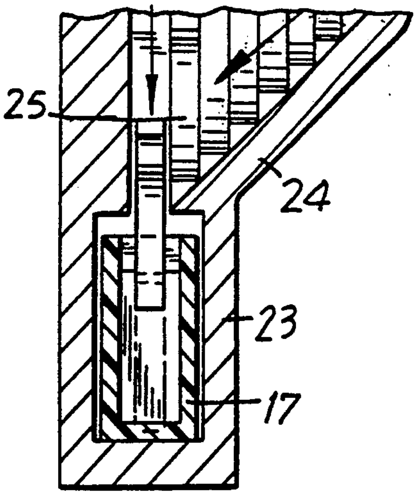
FIG. 6 is a cross-section of a feed chute full of metal connectors of the machine of FIG. 4 as well as a metal connector being inserted into the plastic housing of the shunt.
Figure 7:
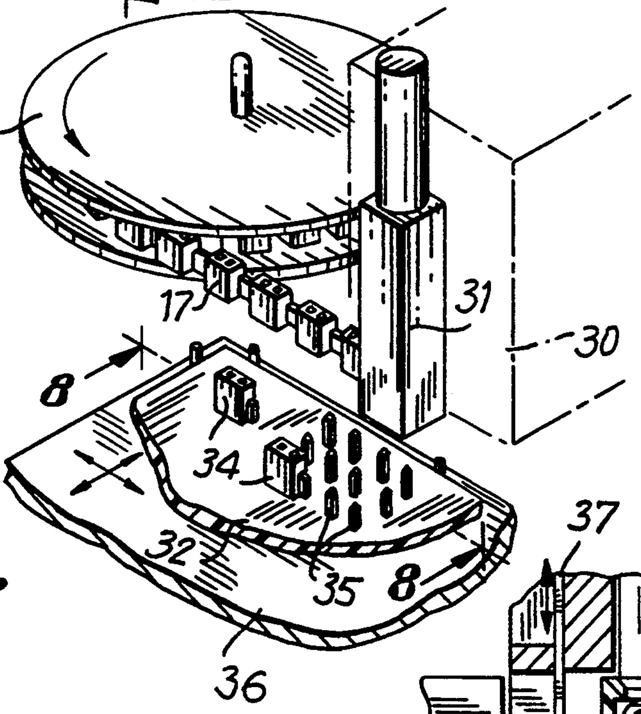
FIG. 7 shows a supply reel of shunts being inserted by a second machine onto a PWB on its X-Y table.
Figure 8:
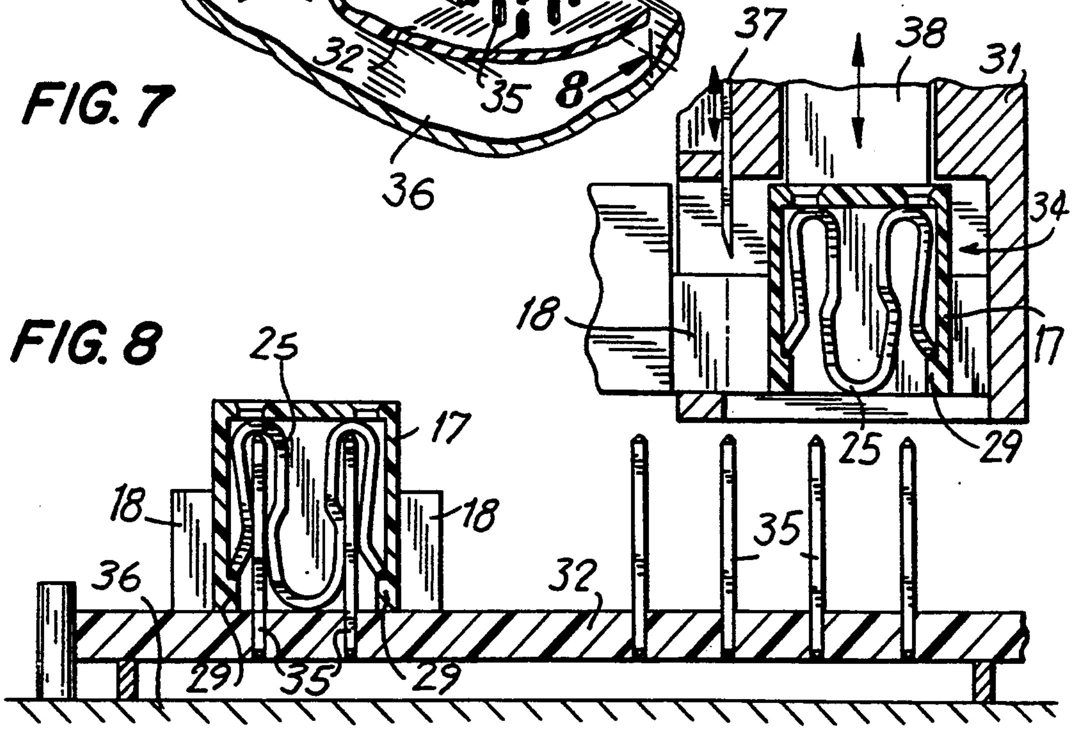
FIG. 8 is a schematic cross-section showing how the shunt fits onto terminals on the PWB.

The metal spring clips 25 are supplies from a reel of continuous parts connected together by web pieces. The secondary operation of the assembly machine detaches the spring clip from its strip fed along chute 24 and inserts it into the shunt housing by a ram. FIG. 5 shows a metal spring clip 25 being inserted into a plastic shunt housing 17 on the strip. The spring clip is locked into the plastic housing by a step up lock 29 in the cavity of the housing. The step up lock 29 allows the metal insert to be easily pushed in but then difficult to remove past the step in the shunt housing. The completed shunt (with its spring clip) is wound on reel 21. For simplicity, FIG. 6 shows the spring clips 25 fed as discrete items along chute 24. But, as previously described, as is known, the spring clips can be shaped by stamping into a continuous strip, reeled, and then fed to the assembly machine of FIG. 4 from a reel. Afterwards, the reel 21 is flipped over so that the open end of the shunt piece is facing downward ready for insertion on a terminal on a PCB. The flipped reel 21′ is then mounted to another machine 30 which separates the individual shunt 17 from its strip and inserts it onto a predetermined position on pin terminals of a PCB. FIG. 7 shows the shunt supply reel 21′ feeding one by one the strip of shunts into the insertion head 31 of the machine to be inserted onto a PCB board 32. FIG. 7 also shows some finished shunts (now referenced 34) already inserted onto the pin terminals 35 on the PCB on an X-Y table 36 of the machine which has been positioned under the inserter head 31. FIG. 8 shows the X-Y table 36 and the PCB 32 with a shunt 34 inserted on terminals 35 at the left. FIG. 8 also illustrates a new shunt 34 in the inserter head 31 being cut along the web 18 by shear tool 37 from the continuous shunt strip and about to be inserted on the underlying terminals 35 on the PCB 32 by means of ram 38.

Figure 9:
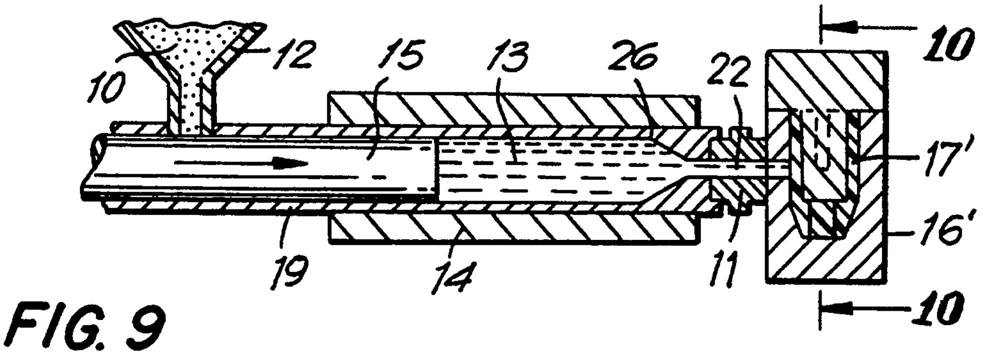
FIG. 9 is a view similar to FIG. 1 showing an injection molding process for a wire end terminal.
Figure 10:
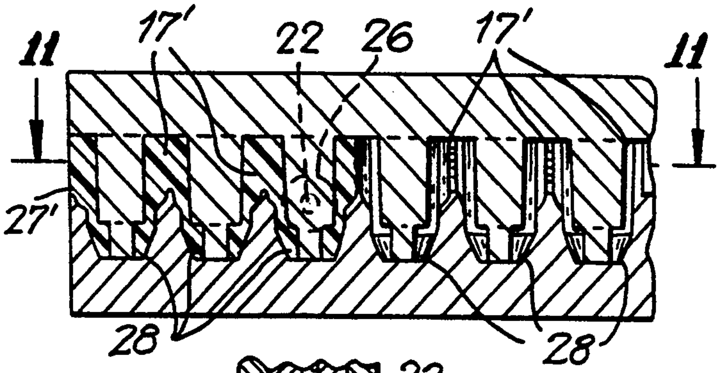
FIG. 10 is a cross-section along the line 10—10 of FIG. 9 of the mold for the plastic housing part of the wire end terminal.
Figure 11:
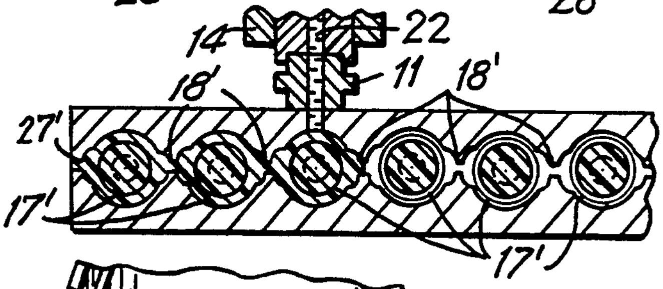
FIG. 11 is a cross-section along the line 11—11 of FIG. 10, also showing an injection gun going into the side of the mold.
Figure 12:
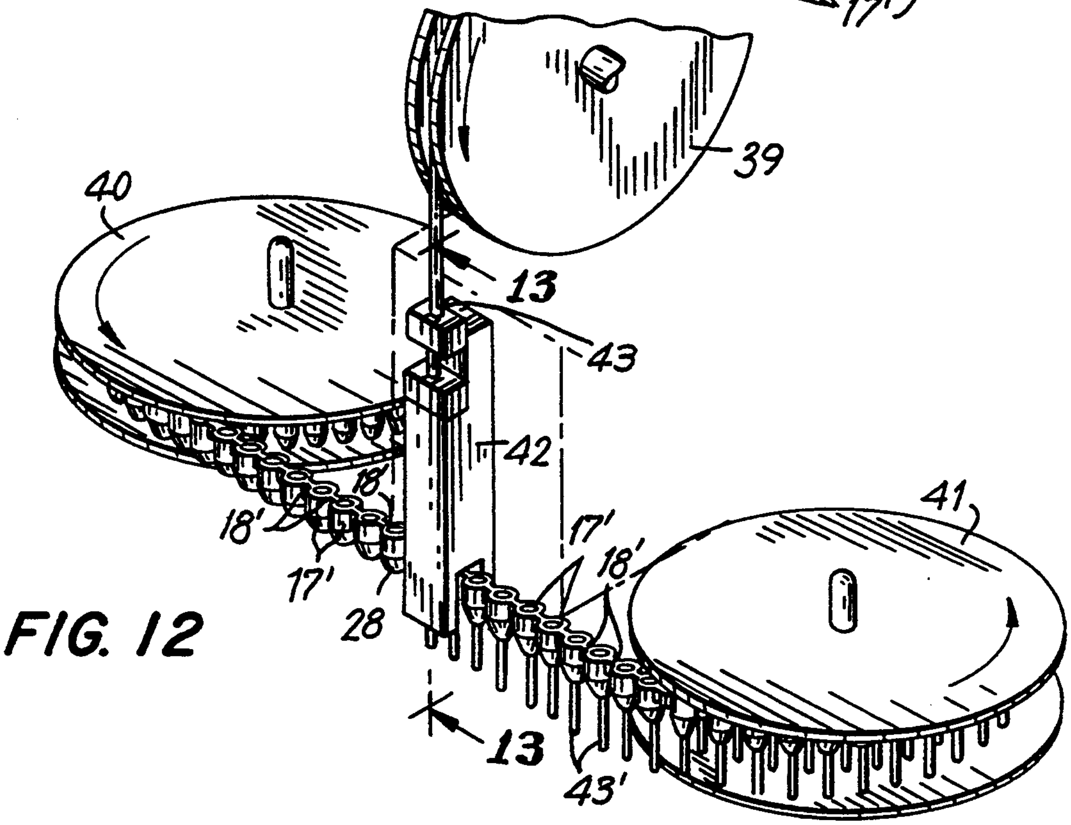
FIG. 12 is a schematic view of a supply reel of the housing part of the wire end terminal going through an assembly machine and receiving the hollow metal connector part, and then being rewound onto another supply reel.
Figure 13:
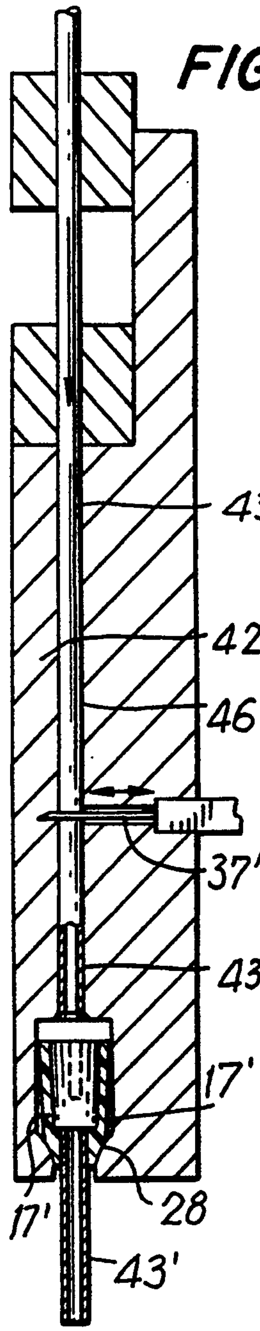
FIG. 13 is a schematic view of a chute on the machine of FIG. 12 with an endless hollow connector being cut and inserted into the plastic housing of the wire end terminal.

FIGS. 9–11 show the manufacture of the plastic housing, or insulator sleeve, part of the wire end terminal. The injection molding process previously described is used to manufacture the tapered plastic insulator of the wire end terminal 17′. The mold 16′ makes a discrete amount of plastic parts 17′ all interconnected by thin, severable plastic strips or webs 18′. At the end of the strip of parts there is a web extension 27′ that is put in the subsequent made mold and fused to the next strip, as also previously described. FIG. 12 shows the continuous strip of plastic parts wound on a reel 40 and fed into an assembly machine head 42. As a secondary operation, the assembly machine inserts a flared hollow metal tube into the insulator sleeve to make the wire end terminal. One way to make this wire and terminal is to have loose flared hollow tube parts fed into the assembly machine by way of a hopper and then by an escapement mechanism, to line up the parts which are then fed one by one to the assembly head to be inserted into the insulated plastic part by a ram. Another way is shown in FIGS. 12 and 13. A hollow piece of wire tube 43′ is cut 37′ from a tubular supply on a reel 39 and widened, or flared, at one end as it is inserted into the tapered part 28 of the plastic housing part 17′. The wire end terminal pieces (flared hollow wirepieces 43′ inserted into tapered plastic parts 17′) are now wound onto another supply reel 41. FIG. 13 shows chute 46 with the shear cutting tool 37′ used to cut the hollow wire piece 43′ from the endless strip of hollow wire 43. The hollow wire 43 is fed down the chute 46, cut with the shear cutting tool 37′ and inserted into the tapered plastic housing part 17′. The hollow metal tube is flared at the end to fasten tightly into the insulating sleeve. The wire end terminal parts, including the tapered housing part 17′ with the inserted flared hollow metal wire tube 43′, connected together by webs 18′, are wound onto supply reel 41.

Figure 14:
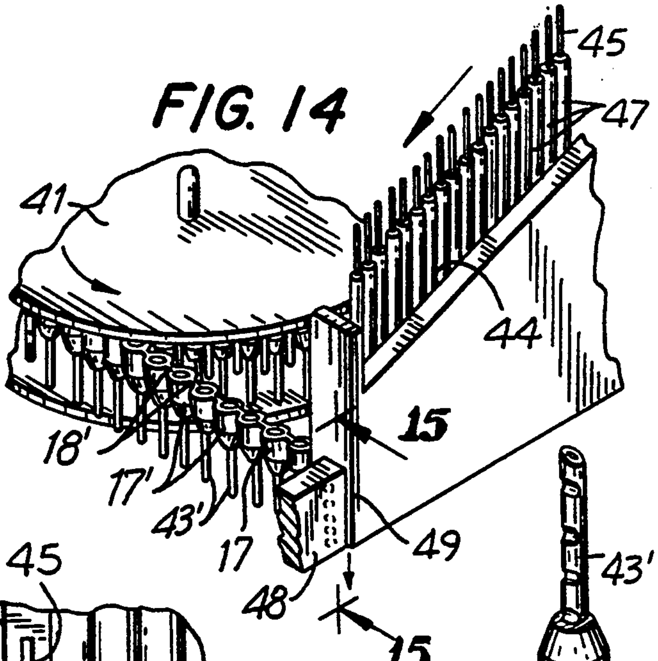
FIG. 14 schematically illustrates a supply reel of wire end terminals being fed into a machine for useably onto wire pieces.
Figure 15:
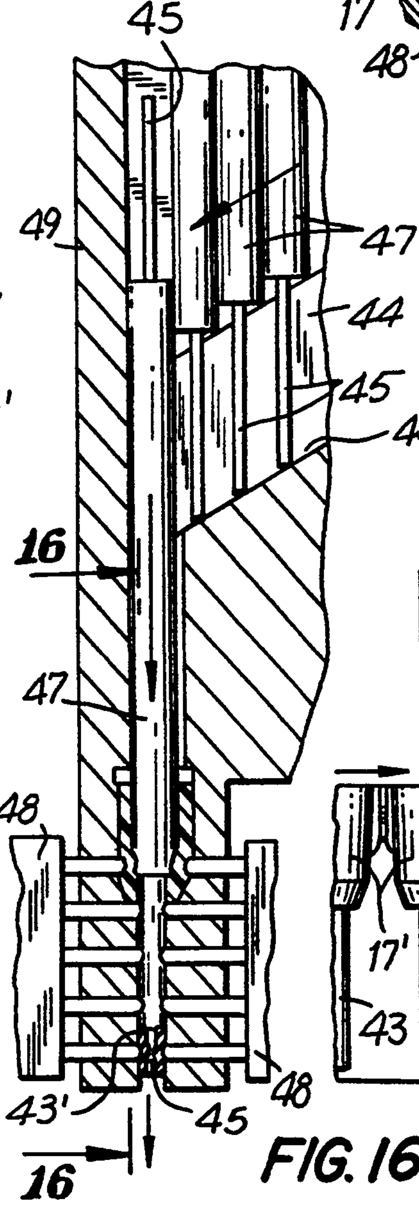
FIG. 15 schematically illustrates the wire end terminal being crimped onto the wire piece.
Figure 16:
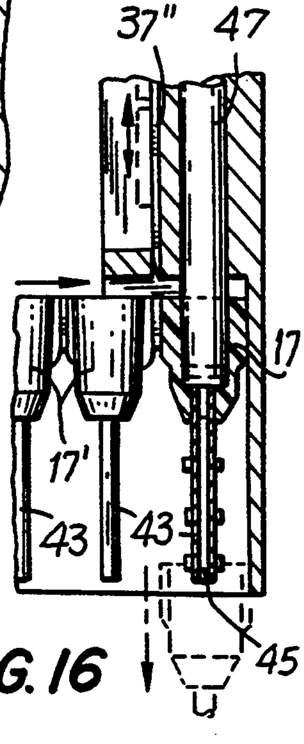
FIG. 16 is a magnified view of the wire piece being assembled with the wire end terminal and then being cut from the supply strip.
Figure 17:
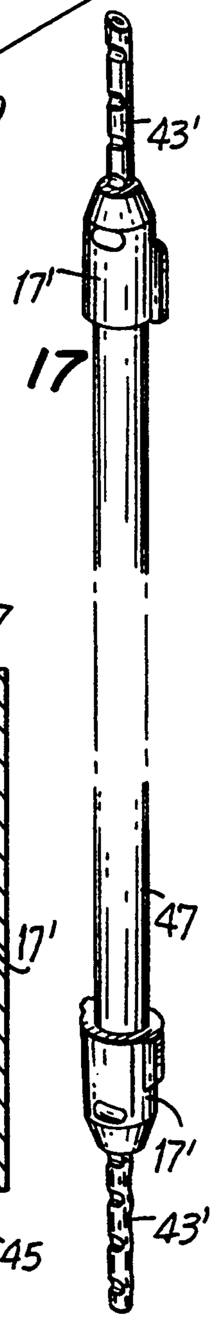
FIG. 17 shows the end product made by the process illustrated in FIGS. 9-16, namely, a wire piece with wire end terminals on both ends.

Reel 41 is then mounted onto another insertion or crimping machine that inserts insulated wire pieces 47 into the wire end terminals 17′. The insulated wire pieces are fed to the machine after having the insulation stripped off their ends. The stripped lead wire 45 is then inserted and crimped within the wire end terminal piece. One method of achieving this is to have the insulated wires 47 already stripped at its ends 45 and fed down a chute 44 to the insertion head. FIG. 14 shows the insulated wire 47 being vertically fed down a chute 44 into the insertion head of the machine 49. The bare wire 45 at the end of the insulated wire is inserted into the wire end terminator part and crimped into place as depicted in FIG. 15. The crimping tool 48 crimps the insulated wire 47, the exposed wire 45 inside of the plastic part of the wire end terminal 17′, as well as the hollow metal wire part 49′ of the wire end terminal. The entire workpiece is then cut from the supply strip on reel 41 by shearing tool 37″ as shown in FIG. 16. FIG. 17 shows the one of the possible end products of the just previously described process: an insulated wire piece 47 crimped into wire end terminals 17′ and 43′.

Instead of the process illustrated in FIGS. 14 and 15, the machine can readily combine a known automatic wire stripper and known crimper. In this case, a continuous length of wire fed from a reel would have its leading end stripped, cut to length, and its trailing edge stripped and then crimped onto the terminal end as depicted in the drawings. As a further alternative, an operator can manually insert the stripped wires into each terminal as they are fed in succession to the crimping head 49.

Figure 18:
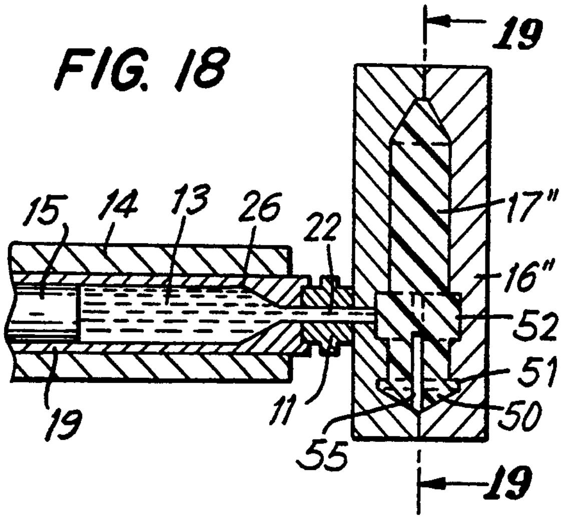
FIG. 18 is a view similar to FIG. 1 showing an injection molding process for a plastic pilot post.
Figure 19:
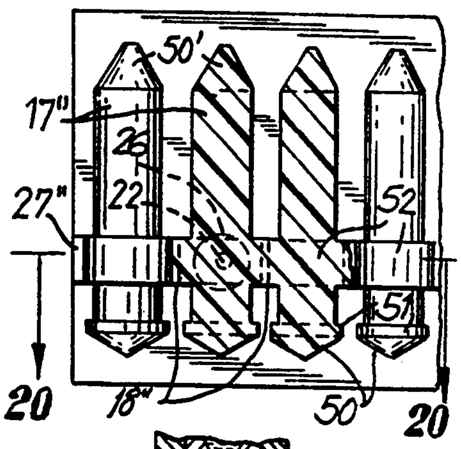
FIG. 19 is a cross-section along the line 19—19 of FIG. 18 of the mold for the pilot post.
Figure 20:
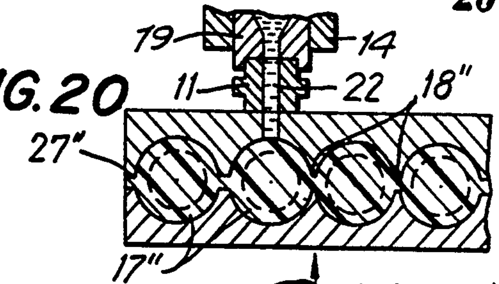
FIG. 20 is a cross-section along the line 20—20 of FIG. 19 also showing an injection gun going into the side of the mold.
Figure 22:
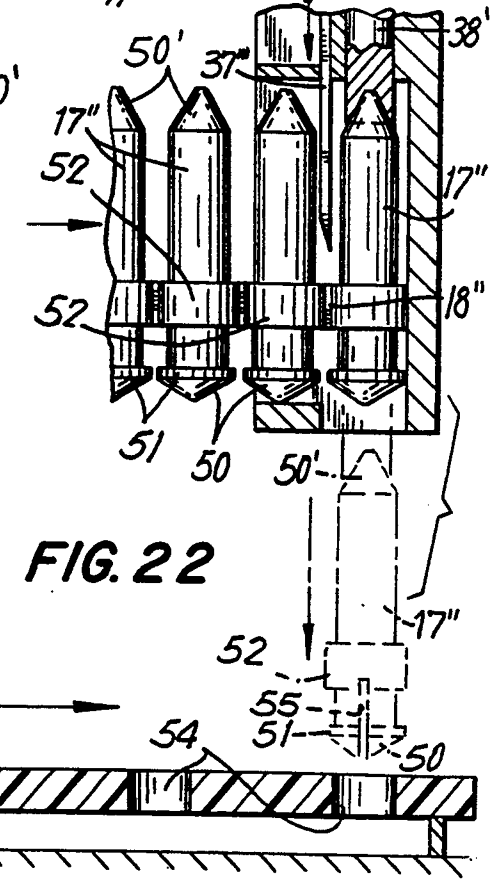
FIG. 22 shows the cross-section of the line 22 in FIG. 21, as well as the end product made by the process illustrated in FIGS. 18–21 namely, a pilot plastic post inserted onto a board.

FIGS. 18–20 shows the injection molding process for pilot plastic posts. The injection molding process bas been previously described. The mold for the pilot plastic post shows the posts each having bevelled ends 50, 50′. The base part 51 is enlarged and provided with a broad plastic band 52 spaced from the enlargement 51. FIG. 18 and FIG. 22 also show a slit 55 formed in the bottom part of the post. The slit 55 extends from the center band 52 through the enlarged part 51 and out the bottom. The slit bifurcates the base section of the post. These features are made in the same injection molding process as previously described. The mold also makes a discrete amount of the plastic parts 17″, all connected to the next plastic part by a thin plastic severable strip or web 18″. The last web 27″ is the extension web, used for fusion with the subsequent sold to make a continuous strip. This process has been previously described. The continuous strip of parts is then wound on a supply reel 53 and fed to an insertion head 31′ of an insertion machine which cuts and inserts the individual post parts into aligned holes 54 in the PCB board 32′. Note the PCB board sits raised above the X-Y table 36 so that the posts 17″ can go through the PCB board and lock into place. FIG. 22 shows a shear tool 37″ cutting an individual pilot post 17″ from its continuous supply strip and being pushed onto a PCB 32′ by a ram 38′. FIG. 22 also shows how the feature parts of the pilot plastic posts are used. The bevelled ends 50 at the bottom are used to easily align the posts while inserting. The posts are inserted in the one workpiece with the enlarged part 51 pushed through the hole 54, thus locking the plastic part 17″ in place. The slit 55 in the pieces are used to form a bifurcated end which can be contracted while inserting and then will expand to keep the enlarged part locked into place. The wider band 52 acts as a stop to prevent the post from being pushed all the way through the workpiece or PCB 32′. The other bevelled end 50′ protrudes above the other electronic workpieces on the PCB.

Figure 21:
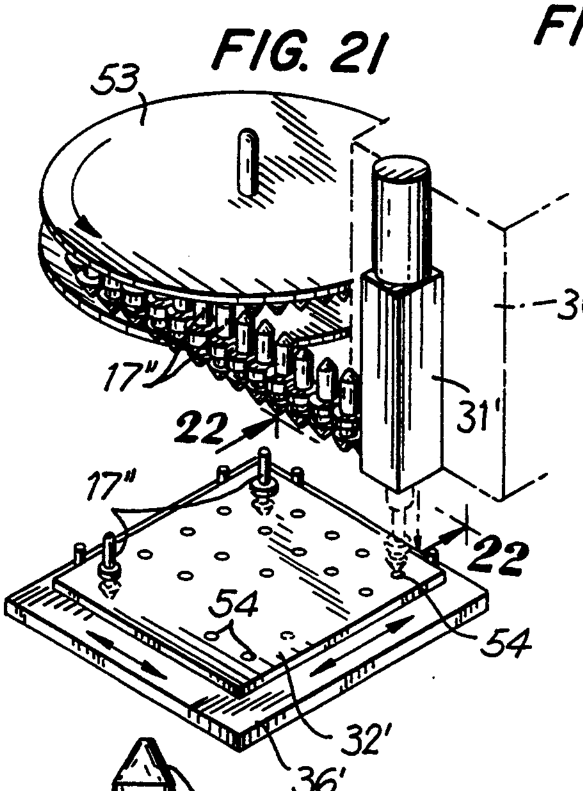
FIG. 21 is a schematic view of a supply reel of plastic pilot post going through an insertion machine and being inserted onto a PWB on its X-Y tables.

Subsequently, not shown, a header with multiple metal pins would be mounted between the two posts 17″ shown in FIG. 21. The two posts would then act to guide assembly of a female connector onto the pins to prevent banding, as earlier described. Alternatively, the metal pins could be separately inserted into the PCB between the pilot posts 17″.

While the invention has been described and illustrated in connection with preferred embodiments, many variations and modifications as will be evident to those skilled in this art may be made therein without departing from the spirit of the invention, and the invention as set forth in the appended claims is thus not to be limited to the precise details of construction set forth above as such variations and modifications are intended to be included within the scope of the appended claims.

What is claimed is:

1. A method for mechanizing the manufacture and assembly of component parts comprising the steps:

(a) forming by a continuous molding process an elongated strip of individual plastic component parts interconnected by severable plastic regions, (b) winding onto a reel the continuous strip formed by step (a), (c) providing an insertion machine having a table for supporting a printed circuit board having holes or pins for receiving said plastic component parts and an insertion head for inserting said component parts, (d) thereafter mounting the reel of step (b) on the insertion machine and feeding the continuous strip from the reel to the insertion head, (e) after mounting of the reel in step (d), controlling the insertion machine to proved the leading component part of the strip to the insertion head while positioning the table so that a printed circuit board on the table is located under the insertion head in a position to receive at a selected location the component part, (f) thereafter operating the insertion machine to cut-off along the severable region the leading component part from the strip and then substantially simultaneously to insert the cut-off part into or onto the printed circuit board at the selected location, (g) repeating steps (e) and (f) to sever and to insert the next leading component part on the strip into or onto a second selected location or on another printed circuit board.

2. A method for mechanizing the manufacture and automatic assembly of component parts comprising the steps:

(a) forming by a continuous molding process an elongated strip of small individual plastic component parts interconnected by severable plastic regions, (b) winding onto a reel the continuous strip formed by step (a), (c) providing an insertion machine having a computer controlled table for supporting a printed circuit board having holes or pins for receiving said plastic component parts and an insertion head for inserting said component parts, (d) thereafter mounting the reel of step (b) on the insertion machine and feeding the continuous strip from the reel to the insertion head, (e) after mounting of the reel in step (d), controlling the insertion machine to provide the leading component part of the strip to the insertion head while positioning the table under control of the computer so that a printed circuit board on the table is located under the insertion head in a position to receive at a selected location the component part, (f) thereafter operating the insertion machine to automatically cut-off along the seveable region the leading component part from the strip and then substantially simultaneously to insert the cut-off part into or onto the printed circuit board at the selected location, (g) repeating steps (e) and (f) to sever and to insert the next leading component part on the strip into or onto a second selected location or on another printed circuit board.

* * * * *